(12) United States Patent
Kim (10) Patent No.: US 6,751,126 B2
(45) Date of Patent: Jun. 15, 2004

(54) CLAMPING CIRCUIT AND NONVOLATILE MEMORY DEVICE USING THE SAME

(75) Inventor: Dae Han Kim, Ichon-Shi (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 7 days.

(21) Appl. No.: 10/326,632

(22) Filed: Dec. 23, 2002

(65) Prior Publication Data

US 2003/0214843 A1 Nov. 20, 2003

(30) Foreign Application Priority Data

May 17, 2002 (KR) .............................. 10-2002-0027484

(51) Int. Cl.$^7$ .............................................. G11C 16/04
(52) U.S. Cl. .............................. 365/185.18; 365/185.25; 365/189.06
(58) Field of Search .................. 365/185.18, 185.25, 365/189.06, 185.33, 189.07

(56) References Cited

U.S. PATENT DOCUMENTS 5,652,722 A * 7/1997 Whitefield ............. 365/185.23

* cited by examiner

Primary Examiner—David Lam
(74) Attorney, Agent, or Firm—Morgan, Lewis & Bockius LLP (57) ABSTRACT

The present invention relates to a clamping circuit and a nonvolatile memory device using the same. Each of switching means driven by a gate voltage of a transistor included in a clamping circuit are installed between a drain terminal of the transistor and a terminal of the well in which the transistor is formed. A given bias is applied to the well and the threshold voltage of the transistor is thus lowered. Thus, the operating speed of the transistor can be increased even at a low power supply voltage without additionally using a manufacture process for the low voltage operation. Further, the ripple voltage can be minimized and generation of defect can be thus prevented. As a result, electrical characteristic and reliability of the circuit is improved.

10 Claims, 4 Drawing Sheets

FIG. 4

CLAMPING CIRCUIT AND NONVOLATILE MEMORY DEVICE USING THE SAME

BACKGROUND OF THE INVENTION

1 Field of the Invention

The invention relates generally to a clamping circuit and a nonvolatile memory device using the same, and more particularly to a clamping circuit capable of improving the operating speed at a low operating voltage and electrical characteristics without using a manufacture process that allows the clamp circuit to operated at a low voltage.

2. Description of the Prior Art

In order to improve the level of integration and lower power consumption, a research and development on a circuit that operates at a low operating voltage has recently been actively made.

Meanwhile, if a voltage applied to the device is, increased as the level of integration in the device is increased, the device may be broken to cause defect. Thus, a clamping circuit for constantly supplying a voltage under which the device stably operates is required. In other words, the clamping circuit must supply a stable voltage under which the device properly operates regardless of the operation of the peripheral circuits or variation in the power supply voltage.

For example, a word line voltage and a bit line voltage (or drain voltage) are applied to the flash memory cell for a program operation or an erase operation. If the bit line voltage is applied high, the flash memory cell may be damaged. Thus, it is required that a constant voltage lower than the operating voltage must be stably applied to the bit line. To this end, the clamping circuit is employed.

A case where the bit line voltage is stably applied to the flash memory cell using the clamping circuit will be now explained.

Figure 1:
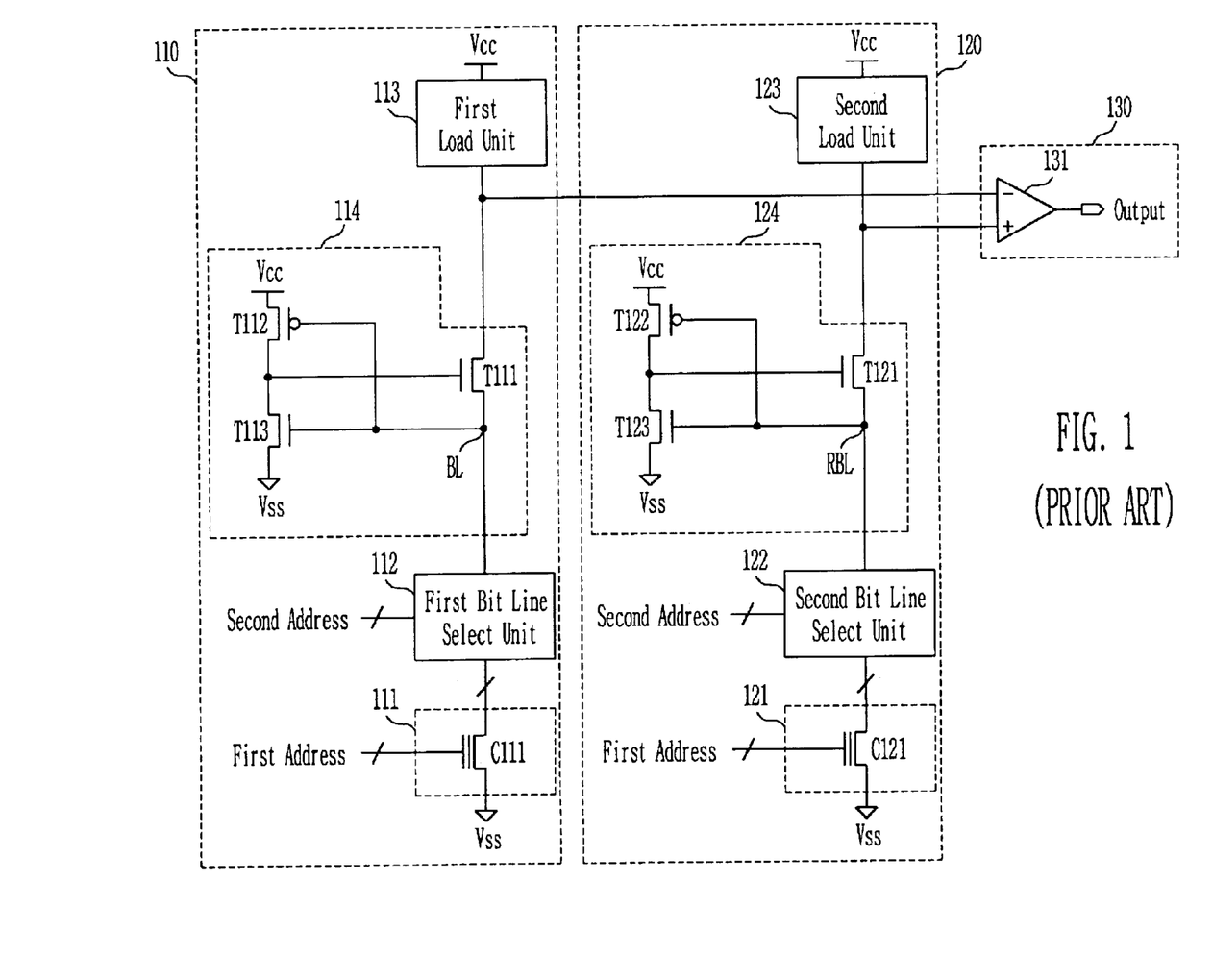
FIG. 1 is a circuit diagram for explaining a clamping circuit and a nonvolatile memory device using the same according to the prior art.

FIG. 1 is a circuit diagram for explaining the clamping circuit and the nonvolatile memory device using the same according to the prior art.

Referring to FIG. 1, a typical nonvolatile memory device includes a main flash memory unit 110, a reference flash memory unit 120 for generating a reference signal in order to verify a program state or an erase state of a selected flash memory cell C111 of the main flash memory unit 110, and a compare unit 130 having a compare means 131 for comparing the amount of current flowing into the flash memory cell C111 of the main flash memory unit 110 and a reference flash memory cell C121 of the reference flash memory unit 120 to determine data stored at the flash memory cell.

Of them, the main flash memory unit 110 includes a main flash memory cell array 111 having a plurality of operating flash memory cells (for convenience, only one flash memory cell shown), a first bit line select unit 112 for selecting one bit line BL of a plurality of bit lines (for convenience, only one bit line shown) like a Y address decoder, a first load unit 113 for supplying the power supply voltage (Vcc), and a first clamping circuit 114 for controlling the voltage applied from the first load unit 113 to the bit line node BL so that a stable voltage can be applied to the bit line node BL.

Meanwhile, the reference flash memory unit 120 includes a reference flash memory cell array 121 having a plurality of reference flash memory cells (for convenience, only one flash memory cell shown), a second bit line select unit 122 for selecting one bit line RBL of a plurality of bit lines (for convenience, only one bit line shown) like the Y address decoder, a second load unit 123 for supplying the power supply voltage (Vcc), and a second clamping circuit 124 for controlling the voltage applied from the second load unit 123 to the bit line node RBL so that a stable voltage can be applied to the bit line node RBL.

Further, the first clamping circuit 114 of the main flash memory unit 110 has a first NMOS transistor T111 connected between the first load unit 113 and the bit line node BL, a PMOS transistor T112 connected between the power supply voltage (Vcc) terminal and a gate electrode of the first transistor T111, for supplying charges to the gate electrode of the first NMOS transistor T111 depending on the potential of the bit line node BL, and a second NMOS transistor T113 connected between the gate electrode of the first transistor T111 and a ground voltage (Vss) terminal, for discharging the charges from the gate electrode of the first NMOS transistor T111 to the ground voltage (Vss) terminal depending on the potential of the bit line node BL. At this time, the PMOS transistor T112 and the first and second NMOS transistors T111 and T113 operate as a variable resistor element the on resistance of which is changed depending on the voltage applied to the gates of the transistor T112, T111 and T113. By controlling the voltage of the bit line node BL using the first clamping circuit 114 constructed above, the voltage of the bit line node BL can be applied to the main flash memory cell C111 as a stable voltage under which the device properly operates.

Furthermore, the second clamping circuit 124 included in the reference flash memory unit 120 has the same structure as the first clamping circuit 114 included in the main flash memory unit 110.

The operation of the nonvolatile memory device having the clamping circuit will be explained, wherein the operation of the clamping circuit 114 will be explained on the basis of the main flash memory unit 110 since the main flash memory unit 110 and the reference flash memory unit 120 have the same basic structure and operation.

At an initial state being a previous state that the nonvolatile memory device normally operates, the voltages of all the nodes including the bit line node BL are 0V. The voltage of 0V of the bit line node BL turns on the PMOS transistor T112 in the clamping circuit 114, which has the gate connected to the bit line node BL and turns off the second NMOS transistor T113. The power supply voltage (Vcc) is applied to the gate electrode of the first NMOS transistor T111 through PMOS transistor T112 of the ON state, so that the first NMOS transistor T111 is turned on.

If the nonvolatile memory device starts to operate through the initial state, the power supply voltage (Vcc) is applied to the nonvolatile memory device through the first load unit 113.

At this time, as the device is higher integrated, if the power supply voltage (for example, 1.6V) is applied to the flash memory cell C111 intact, the cell C111 may be damaged. In order to prevent this, the first clamping circuit 114 adjusts the voltage supplied from the first load unit 113 to be a voltage under which the device can stably operate (hereinafter called 'operating voltage') and then outputs the operating voltage to the bit line node BL, which will be described in more detail.

If the voltage supplied from the first load unit 113 is applied to the bit line node BL through the first NMOS transistor T111 and the voltage of the bit line node BL becomes then higher than the operating voltage, the PMOS transistor T112 becomes gradually close to the OFF state to have higher resistance value. The second NMOS transistor T113 becomes gradually close to the ON state to have lower resistance value. Due to this, the amount of the charges supplied from the power voltage source to the gate electrode of the first NMOS transistor T111 becomes higher than the amount of the charges discharged from the gate electrode of the first NMOS transistor T111 to the ground voltage source. As the voltage applied to the second NMOS transistor T113 is lowered, the voltage applied to the gate electrode of the first NMOS transistor T111 is lowered. As a result, the resistance component of the first NMOS transistor T111 is increased. As the resistance component of the first NMOS transistor T111 is increased, the amount of current supplied to the bit line node BL is reduced. As the voltage applied to the first NMOS transistor T111 is increased, the voltage supplied to the bit line node BL is lowered.

If the voltage of the bit line node BL is lowered than the operating voltage, the PMOS transistor T112 becomes close to the ON state and the second NMOS transistor T113 becomes close to the OFF state. Therefore, the amount of the charges supplied from the power voltage source to the gate electrode of the first NMOS transistor T111 becomes higher than the amount of the charges discharged from the gate electrode of the first NMOS transistor T111 to the ground voltage source. Also, the voltage applied to the second NMOS transistor T113 is increased. As the voltage applied to the gate electrode of the first NMOS transistor T111 is increased, the resistance component of the first NMOS transistor T111 is reduced. Due to this, the voltage of the bit line node BL is again increased to the operating voltage.

As a result, the operation of the first clamping circuit 114 is performed in a negative feedback operation. The voltage of the bit line node BL is negative-feedbacked depending on the voltage of the bit line node BL, so that a stable voltage can be applied to the flash memory cell C111.

Through the above operation, the voltage of the bit line node BL is kept with a stable operating voltage under which the cell can properly operate.

As described above, the operation of the reference flash memory unit 120 is same to that of the main flash memory unit 110. Thus, explanation on the operation of the reference flash memory unit 120 will not be given in order to avoid overlapping.

After the voltage of the bit line node BL is stabilized with the operating voltage, the first and second bit line select units 112 and 122 in the main flash memory unit 110 and the reference flash memory unit 120 select one bit line according to a second address signal and select the main flash memory cell C111 and the reference flash memory cell C121 according to the first address signal. Also, the compare unit 130 compares the amount of current flowing into the main flash memory cell C111 and the reference flash memory cell C121 to read out data stored at the main flash memory cell C111 or verify the program/erase operations.

As described above, the first and second clamping circuits 114 and 124 serve to prevent excess voltage from being applied to the flash memory cell and control the voltage applied to the bit line so that the operation can be performed stably.

However, if a case that the manufacture process for the operation of the low voltage is used as the power supply voltage is lowered in order to lower power consumption of the device, there is no problem in the transistor when the threshold voltage is low (for example, 0.3V~0.4V). If the threshold voltage of the transistor is high (for example, 0.8V), there is a problem that the operating speed is lowered.

In other words, if the driving voltage applied to the gate electrode is not sufficiently nigh compared to the threshold voltage of the transistor, the switching operation is not smoothly performed and the reaction speed of the transistor is lowered.

Therefore, if the operating speed of the clamping circuit is lowered, hard ripples are generated until the voltage of a specific node is stabilized. As this ripple adversely affects the device, there are problems that the operating speed is lowered and the device may be damaged.

As a result, in order to improve the operating speed of the device at a low power supply voltage, it is required that various devices including the transistor be manufactured by separately applying the manufacture process for the operation of the low voltage. In this case, there are problems that the technology for which this manufacture process is applied is difficult and the cost is high.

SUMMARY OF THE INVENTION

The present invention is contrived to solve the above problems and an object of the present invention is to provide a clamping circuit and a nonvolatile memory device using the same, capable of improving an operating speed of a transistor at a low power supply voltage without using a manufacture process for a low voltage operation, minimizing a ripple voltage and preventing defect due to the ripple voltage.

In order to accomplish the above object, a switching means driven by a gate voltage of the transistor included in a clamping circuit is positioned between a drain terminal of the transistor and a terminal of a well in which the transistor is formed, so that a given bias is applied to the well and a threshold voltage of the transistor is thus lowered.

In a first preferred embodiment, a clamping circuit according to the present invention is characterized in that it comprises a first transistor connected between a first node and a second node, a charge supply means connected between a gate electrode of the first transistor and a power voltage terminal, for supplying charges to the gate electrode of the first transistor depending on a voltage of the second node in order to control the voltage of the second node, a charge discharge means connected between the gate electrode of the first transistor and a ground voltage terminal, for discharging the charges from the gate electrode of the first transistor depending on the voltage of the second node in order to control the second node, and switching means each connected between a well terminal and a drain terminal of a second transistor constituting the charge supply means, for applying a bias to the well terminal of the second transistor depending on the gate voltage of the second transistor to lower the threshold voltage of the second transistor.

In the above, the first transistor is a NMOS transistor, the second transistor and the switching means are PMOS transistors, and the well is an N well.

In a second preferred embodiment, a clamping circuit according to the present invention is characterized in that it comprises a first transistor connected between a first node and a second node, a charge supply means connected between a gate electrode of the first transistor and a power voltage terminal, for supplying charges to the gate electrode of the first transistor depending on a voltage of the second node in order to control the voltage of the second node, a charge discharge means connected between the gate electrode of the first transistor and a ground voltage terminal, for discharging the charges from the gate electrode of the first transistor depending on the voltage of the second node in order to control the second node, and switching means each connected between a well terminal and a drain terminal of a second transistor constituting the charge discharge means, for applying a bias to the well terminal of the second transistor depending on the gate voltage of the second transistor to lower the threshold voltage of the second transistor.

In the above, the first transistor, the second transistor and the switching means are a NMOS transistor, and the well is a triple P well.

In a third preferred embodiment, a clamping circuit according to the present invention is characterized in that it comprises a first transistor connected between a first node and a second node, a charge supply means connected between a gate electrode of the first transistor and a power voltage terminal, for supplying charges to the gate electrode of the first transistor depending on a voltage of the second node in order to control the voltage of the second node, a charge discharge means connected between the gate electrode of the first transistor and a ground voltage terminal, for discharging the charges from the gate electrode of the first transistor depending on the voltage of the second node in order to control the second node, first switching means each connected between a well terminal and a drain terminal of a second transistor constituting the charge supply means, for applying a bias to the well terminal of the second transistor depending on the gate voltage of the second transistor to lower the threshold voltage of the second transistor, and second switching means each connected between a well terminal and a drain terminal of a third transistor constituting the charge discharge means, for applying a bias to the well terminal of the third transistor depending on the gate voltage of the third transistor to lower the threshold voltage of the third transistor.

In the above, the first transistor, the third transistor and the second switching means are a NMOS transistor, and the second transistor and the first switching means are a PMOS transistor. Also, the well of the second transistor is an N well and the well of the third transistor is a triple P well.

A nonvolatile memory device according to the present invention is characterized in that it comprises an main flash memory cell array to which a first address signal is applied, wherein the main flash memory cell array has a plurality of operating flash memory cells, a first bit line select unit for selecting a bit line of the main flash memory cell array according to a second address signal, a first clamping circuit claimed in one of claims 1~9 for controlling the bit line voltage of the main flash memory cell array, a reference flash memory cell array to which the first address signal is applied, wherein the reference flash memory cell array has a plurality of reference flash memory cells, a second bit line select unit for selecting a bit line of the reference flash memory cell array according to the second address signal, a second clamping circuit claimed in one of claims 1~9 for controlling the bit line voltage of the reference flash memory cell array, and a compare unit for comparing the amount of current flowing into the main flash memory cell and the reference flash memory cell selected by the first and second address signals to detect a state of the operating flash memory cell.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings, in which like reference numerals are used to identify the same or similar parts.

Figure 2:
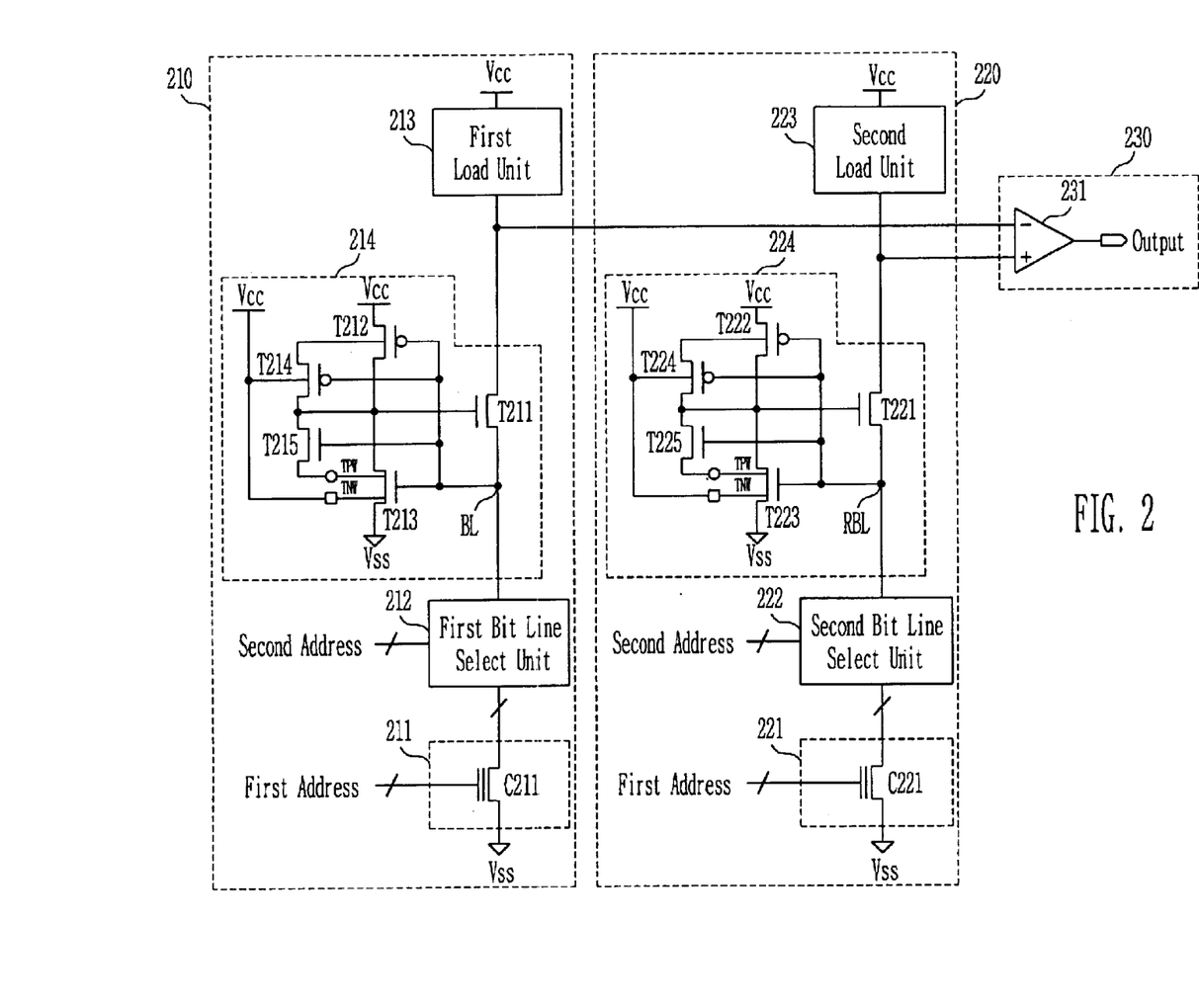
FIG. 2 is a circuit diagram for explaining a clamping circuit and a nonvolatile memory device using the same according to a first embodiment of the present invention.

FIG. 2 is a circuit diagram for explaining a clamping circuit and a nonvolatile memory device using the same according to a first embodiment of the present invention.

Referring to FIG. 2, a typical nonvolatile memory device includes a main flash memory unit 210, a reference flash memory unit 220 for generating a reference signal in order to verify a program state or an erase state of a selected main flash memory cell C211 of the main flash memory unit 210, and a compare unit 230 having a compare means 231 for comparing the amount of current flowing into the flash memory cell C211 of the main flash memory unit 210 and a reference flash memory cell C221 of the reference flash memory unit 220 to determine data stored at the flash memory cell.

Of them, the main flash memory unit 210 includes an main flash memory cell array 211 having a plurality of operating flash memory cells (for convenience, only one flash memory cell shown), a first bit line select unit 212 for selecting one bit line BL of a plurality of bit lines (for convenience, only one bit line shown) like a Y address decoder, a first load unit 213 for supplying the power supply voltage (Vcc), and a first clamping circuit 214 for controlling the voltage applied from the first load unit 213 to the bit line node BL so that a stable bit line voltage can be applied.

Meanwhile, the reference flash memory unit 220 includes a reference flash memory cell array 221 having a plurality of reference flash memory cells (for convenience, only one flash memory cell shown), a second bit line select unit 222 for selecting one bit line RBL of a plurality of bit lines (for convenience, only one bit line shown) like the Y address decoder, a second load unit 223 for supplying the power supply voltage (Vcc), and a second clamping circuit 224 for controlling the voltage applied from the second load unit 223 to the bit line node RBL so that a stable bit line voltage can be applied.

Further, the first clamping circuit 214 in the main flash memory unit 210 has a first NMOS transistor T211 connected between the first load unit 213 and the bit line node BL, a PMOS transistor T212 connected between the power supply voltage (Vcc) terminal and a gate electrode of the first transistor T211 and driven by the potential of the bit line node BL, a second NMOS transistor T213 connected between the gate electrode of the first transistor T211 and the ground voltage (Vss) terminal and driven by the potential of the bit line node B, a first switching means T214 connected between a N well terminal in which a PMOS transistor T212 is formed and the drain terminal of the PMOS transistor T212 and driven by the voltage applied to the gate of the PMOS transistor T212, and a second switching means T215 connected between a triple P well terminal (TPW) in which a second NMOS transistor T213 is formed and the drain terminal of the second NMOS transistor T213 and driven by the voltage applied to the gate of the second NMOS transistor T213.

At this time, the PMOS transistor T212 and the first and second NMOS transistors T211 and T213 operate as a variable resistor device the on resistance of which is changed depending on the voltage applied to the gates of the transistor T212, T211 and T213. Also, the PMOS transistor T212 serves as a charge supply means for supplying charges to the gate electrode of the first NMOS transistor T211. The second NMOS transistor T213 serves as a charge discharge means for discharging the charges from the gate electrode of the first NMOS transistor T211 to the ground voltage (Vss) terminal. By controlling the voltage of the bit line node BL using the first clam-pin g circuit 214 constructed above, the voltage of the bit line node BL can be applied to the main flash memory cell C211 as a stable voltage under which the device properly operates.

In the above, the first switching means T214 consists of a PMOS transistor and the second switching means T215 consists of a NMOS transistor. The drain voltage of the PMOS transistor T212 is applied to the N well in which the PMOS transistor T212 is formed by means of the first and second switching means T214 and T215 driven by the voltage of the bit line node BL. The drain voltage of the second NMOS transistor T213 applied to the triple P well in which the second NMOS transistor T213 is formed. Due to this, as the threshold voltages of the PMOS transistor T212 and the second NMOS transistor T213 are lowered, the operating speeds of the PMOS transistor T212 and the second NMOS transistor T213 can be increased even at a low power supply voltage (Vcc).

The operation of the nonvolatile memory device having the clamping circuit, for example the clamping circuit will be below described. At this time, as the main flash memory unit 210 and the reference flash memory unit 220 have the same basic structure and operation and the second clamping circuit 224 included in the reference flash memory unit 220 has the same structure as the first clamping circuit 214 included in the main flash memory unit 210, the operation of the clamping circuit 214 will be described on the basis of the main flash memory unit 210.

At an initial state being a previous state that the nonvolatile memory device normally operates, the voltages of all the nodes including the bit line node BL are 0V. The PMOS transistor T212 and the first switching means T214 are turned on and the second NMOS transistor T213 and the second switching means T215 are turned off, in the clamping circuit 214 having the gate connected to the bit line node BL, by the voltage of 0V of the bit line node BL. The power supply voltage (Vcc) is thus applied to the gate electrode of the first NMOS transistor T211 through PMOS transistor T212 of the ON state, so that the first NMOS transistor T211 is turned on. Meanwhile, a first voltage is applied to the N well of the PMOS transistor T212 through the PMOS transistor T212 and the first switching means T214 both of which are turned on, so that the threshold voltage of the PMOS transistor T212 is lowered. At this time, the first voltage has a value of a Vcc-Vthdiode, wherein Vcc represents the power supply voltage and Vthdiode represents the threshold voltage of the junction diode formed between a P+ junction of the PMOS transistor T212 and the N well.

If the nonvolatile memory device starts to operate through the initial state, the power supply voltage (Vcc) is applied to the nonvolatile memory device through the first load unit 213.

At this time, as the device is higher integrated, if the power supply voltage (for example, 1.6V) is applied to the flash memory cell C211 intact, the cell C211 may be damaged. In order to prevent this, the first clamping circuit 214 adjusts the voltage supplied from the first load unit 213 to be a voltage under which the device can stably operate and then outputs the operating voltage to the bit line node BL, which will be described in more detail.

If the voltage supplied from the first load unit 213 is applied to the bit line node BL through the first NMOS transistor T211 and the voltage of the bit line node BL becomes thus higher than the operating voltage, the first switching means T21 is turned off and the second switching means T215 is turned on. At this time, the resistance component in the PMOS transistor T212 is rapidly increased while becoming close to the OFF state since the threshold voltage of the PMPS transistor T212 is lowered. If the first switching means T214 is turned off, the threshold voltage of the PMOS transistor T212 continues to keep low as the N well terminal of the PMOS transistor T212 is floated and the first voltage applied to the N well is kept intact.

Meanwhile, the charges transferred through the channel of the PMOS transistor T212 are transferred to the triple P well of the second NMOS transistor T213 through the second switching means T215 that is turned on by the voltage of the bit line node BL. A second voltage higher than the ground voltage (Vss) is thus applied to the triple P well. This second voltage is applied as a forward bias to the triple P well and the junction diode consisting of a N+ junction region of the source. At this time, as the second voltage has a value lower than the threshold voltage of the diode even though the second voltage is applied as a forward bias to the junction diode, the diode current of a small amount to the extent that can be disregarded. There is no problem due to the leakage current. As such, if the second voltage is applied as the forward bias to the triple P well of the second NMOS transistor T213, it oppositely functions unlike the body effect to shrink the depletion region of the junction diode. Due to this, as the threshold voltage of the second NMOS transistor T213 is lowered, the second NMOS transistor T213 reacts sensitively to the voltage of the bit line node BL. Therefore, the second NMOS transistor T213 rapidly reacts even if the voltage of the bit line node BL is a little higher than the operating voltage. The resistance component is abruptly reduced and the charges are rapidly discharged toward the ground voltage source.

Due to this, the amount of the charges supplied to the gate electrode of the first NMOS transistor T211 is rapidly reduced and the amount of current discharged from the gate electrode of the first NMOS transistor T211 to the ground voltage source is rapidly increased. Thus, the voltage applied to the gate electrode of the first NMOS transistor T211 is lowered and the resistance component of the first NMOS transistor T211 is thus abruptly increased. The amount of current supplied to the bit line node BL is abruptly reduced while the resistance component of the first NMOS transistor T211 is increased. The voltage of the bit line node BL is abruptly lowered while the voltage applied to the first NMOS transistor T211 is increased.

On the contrary, if the voltage of the bit line node BL is lowered than the operating voltage, the first switching means T214 is turned on and the second switching means T215 is turned off. At the same time, the resistance component of the PMOS transistor T212 is reduced while the PMOS transistor T212 becomes increasingly close to the ON state, and the resistance component of the second NMOS transistor T213 is increased while the second NMOS transistor T213 becomes increasingly close to the OFF state. At this time, as the threshold voltage of the PMOS transistor T212 is lowered since the charges for the first voltage initially applied are kept in the N well of the PMOS transistor T212, the PMOS transistor T212 sensitively reacts to the voltage of the bit line node BL. Thus, as the PMOS transistor T212 rapidly reacts even though the voltage of the bit line node BL is lower a little than the operating voltage, the resistance component of the PMOS transistor T212 is abruptly reduced.

Due to this, the amount of current that is supplied from the power voltage source to the node connected to the gate electrode of the first NMOS transistor T211 is rapidly increased while the amount of current that is discharged from the node connected to the gate electrode of the first NMOS transistor T211 to the ground voltage source is abruptly reduced. Thus, the resistance component of the first NMOS transistor T211 is abruptly reduced while the voltage applied to the gate electrode of the first NMOS transistor T211 is increased. The voltage of the bit line node BL is again increased up to the operating voltage.

As a result, the operation of the first clamping circuit 214 is performed in a negative feedback operation. However, the voltage of the bit line node BL is rapidly negative-feedbacked depending on the voltage of the bit line node BL so that a more stable voltage can be rapidly applied to the flash memory cell C211, by installing the switching means between the drain terminals of the transistors included in the first clamping circuit 214 and the well terminal, respectively, and a given bias is applied to lower the threshold voltages of the transistors.

Through the above operation, the voltage of the bit line node BL is kept as a stable operating voltage under which the cell properly operates. As described above, the operation in the reference flash memory unit 220 is same to that in the main flash memory unit 210. Thus, explanation on the operation in the reference flash memory unit 220 will be not given in order to avoid overlapping.

In the state that the voltage of the bit line node BL is stabilized with the operating voltage, the first and second bit line select units 212 and 222 in the main flash memory unit 210 and the reference flash memory unit 220 select one bit line according to the second address signal and select the main flash memory cell C211 and the reference flash memory cell C221 according to the first address signal. At this time, the compare unit 230 compares the amount of current flowing into the main flash memory cell C211 and the reference flash memory cell C221 to read out data stored at the main flash memory cell C211 or verify the program/erase operations.

As the threshold voltage of the transistor is lowered through the above construction and operation, the operating speed of the device can be improved and the ripple voltage can be minimized without a process for manufacturing a low voltage operating device.

Meanwhile, the switching means is installed between the drain terminal and the well terminal only at the transistor for forming current path along which the charges are discharged toward the ground voltage source. Thus, if a voltage of a specific node such as the bit line node is higher than a target voltage, the voltage of the node can be rapidly lowered down to the target voltage.

A clamping circuit and a nonvolatile memory device using the same according to a second embodiment of the present invention will be below described.

Figure 3:
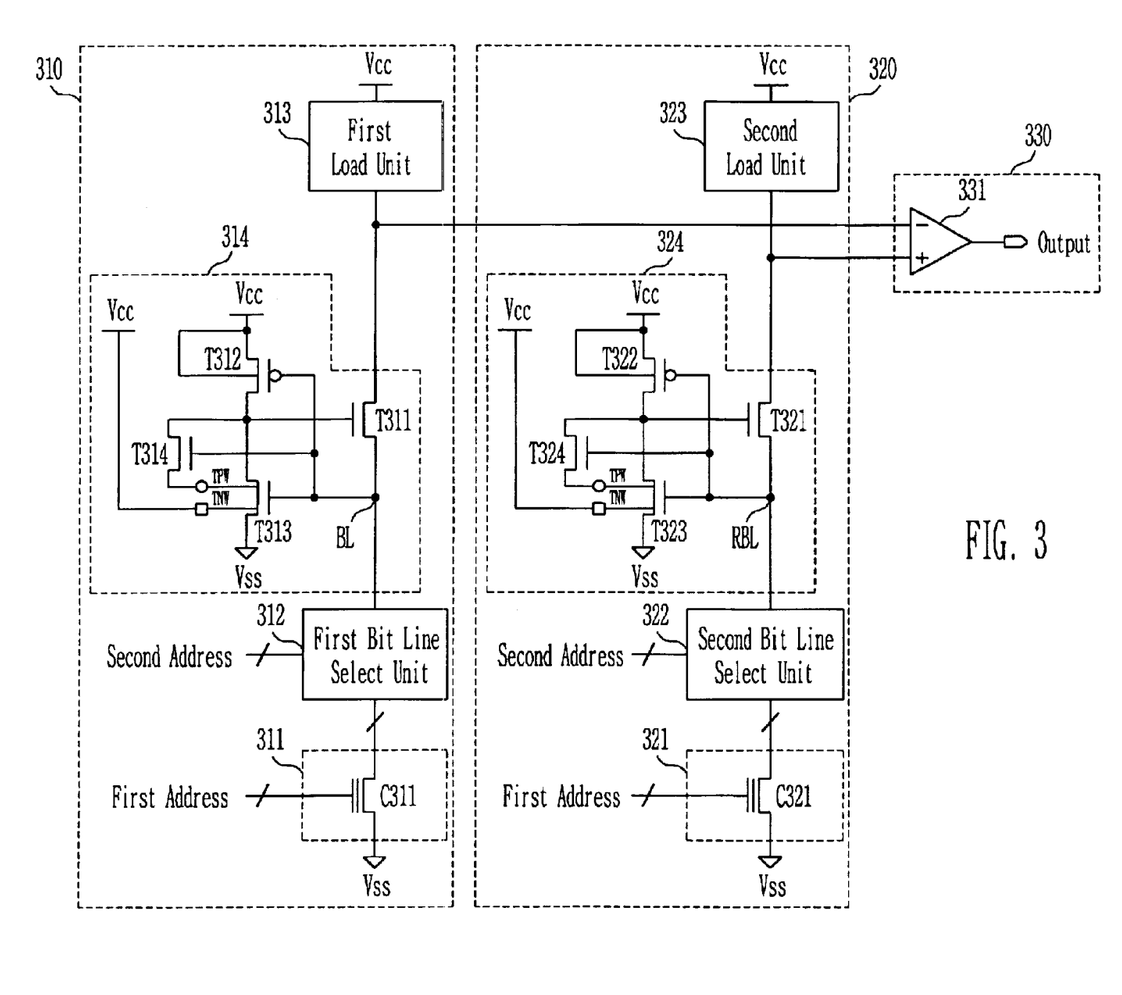
FIG. 3 is a circuit diagram for explaining a clamping circuit and a nonvolatile memory device using the same according to a second embodiment of the present invention.

FIG. 3 is the circuit diagram for explaining the clamping circuit and the nonvolatile memory device using the same according to the second embodiment of the present invention.

As seen from FIG. 3, constituent elements of the nonvolatile memory device comprising a main flash cell array 311, a reference flash cell array 321, first and second bit line select units 312 and 322, first and second load units 313 and 323, and a compare unit 330 having a compare means 331, except for first and second clamping circuits 314 and 324, are same to those of the nonvolatile memory device shown in FIG. 2. Explanation on those elements will be thus omitted. Also, as the construction and operation of the first and second clamping circuits 314 and 324 are same to each other, only the construction and operation of the first clamping circuit 314 will be explained for simplicity.

The first clamping circuit 314 comprises a first NMOS transistor T311 connected between the first load unit 313 and the bit line node BL, a PMOS transistor T312 connected between the power supply voltage (Vcc) terminal and the gate electrode of the first transistor T311 and driven by the potential of the bit line node BL, a second NMOS transistor T313 connected between the gate electrode of the first NMOS transistor T311 and the ground voltage (Vss) terminal and driven by the potential of the bit line node BL, and a switching means T314 connected between the triple P well (TPW) terminal in which the second NMOS transistor T313 is formed and the drain terminal of the second NMOS transistor T313 and driven by the voltage applied to the gate of the second NMOS transistor T313.

Like in FIG. 2, the PMOS transistor T312, and the first and second NMOS transistors T311 and T313 operate as a variable resistor device the on resistance of which is changed depending on the voltage of the gates of the transistors T312, T311 and T313. Also, the PMOS transistor T312 serves as a charge supply means for supplying charges to the gate electrode of the first NMOS transistor T311 and the second NMOS transistor T313 serves as a charge discharge means for discharging the charges from the gate electrode of the first NMOS transistor T311 to the ground voltage (Vss) terminal. As the amount of current discharged from the gate electrode of the first NMOS transistor T311 toward the ground voltage source is controlled depending on the voltage of the bit line node BL through the above, the voltage of the bit line node BL can be applied as a stable voltage under which the device can properly operate.

In the above, the switching means T314 consists of a NMOS transistor. The drain voltage of the second NMOS transistor T313 is applied to the triple P well in which the second NMOS transistor T313 is formed by the switching means T314 driven by the voltage of the bit line node BL. As the threshold voltage of the second NMOS transistor T313 is thus lowered, the operating speed of the second NMOS transistor T313 can be improved even at a low power supply voltage (Vcc).

The second embodiment of the present invention in FIG. 3 is same to the first embodiment in FIG. 2 in that the threshold voltage of the second NMOS transistor T313 is lowered using the switching means T314 except that the switching means is not provided between the drain terminal of the PMOS transistor T312 and the N well terminal.

Therefore, in the clamping circuit and the nonvolatile memory device using the same according to the second embodiment, a voltage of a specific node such as the bit line node BL is controlled same to a target operating voltage under which the device properly operates. However, if the voltage of the node is higher than the operating voltage, the voltage of the node can be rapidly lowered. Further, the number of the switching means added is small. Thus, the clamping circuit can be more simply implemented.

Meanwhile, the switching means is installed between the drain terminal and the well terminal at the transistor for forming current path along which the charges are supplied form the power voltage source. If the voltage of a specific node such as the bit line node is lower than the target voltage, the voltage of the node can be rapidly raised up to the target voltage.

A clamping circuit and a nonvolatile memory device using the same according to a third embodiment of the present invention will be below described.

Figure 4:
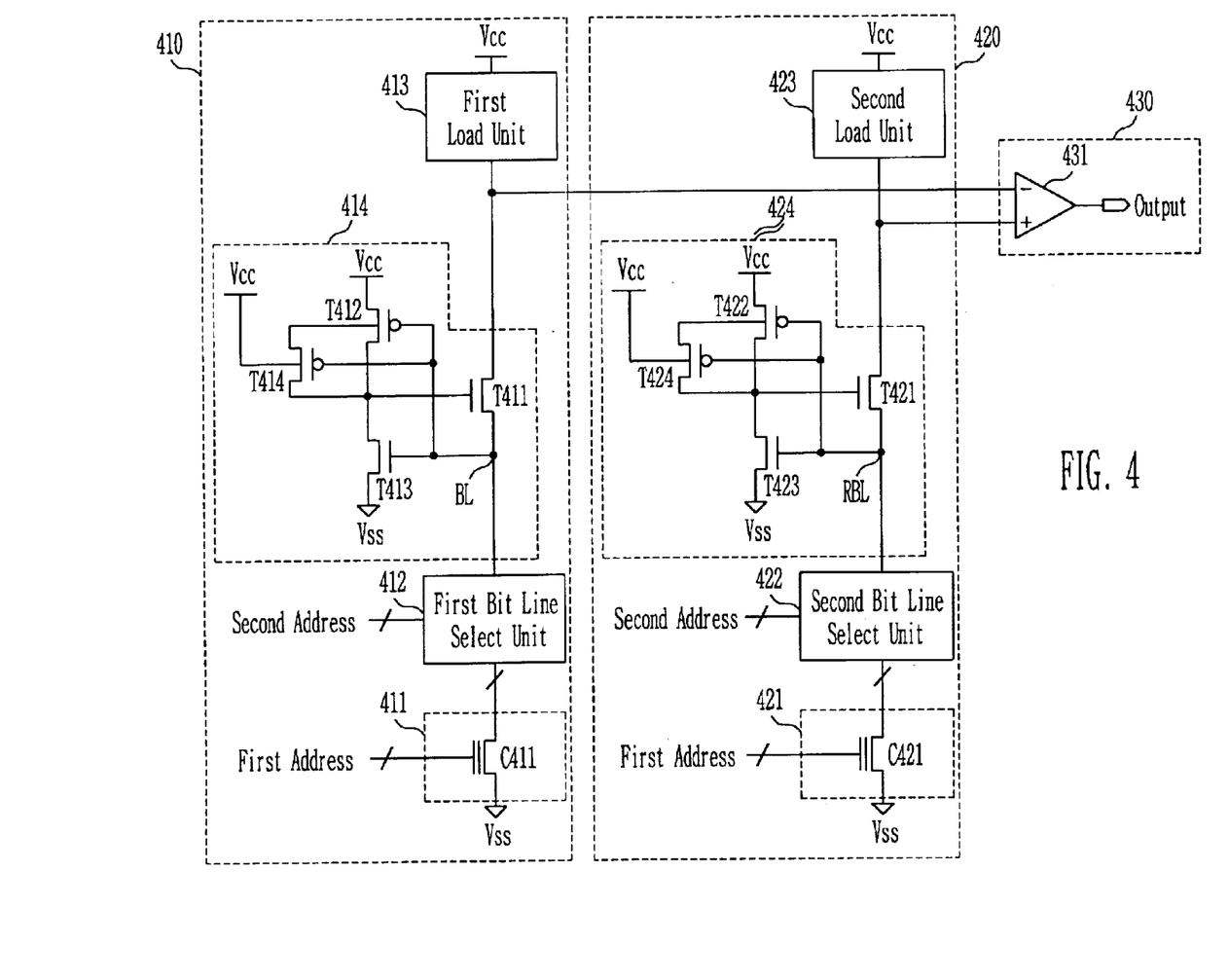
FIG. 4 is a circuit diagram for explaining a clamping circuit and a nonvolatile memory device using the same according to a third embodiment of the present invention.

FIG. 4 is a circuit diagram for explaining the clamping circuit and the nonvolatile memory device using the same according to the third embodiment of the present invention.

As seen from FIG. 4, constituent elements of the nonvolatile memory device comprising a main flash cell array 411, a reference flash cell array 421, first and second bit line select units 412 and 422, first and second load units 413 and 423, and a compare unit 430 having a compare means 431, except for first and second clamping circuits 414 and 424, are same to those of the nonvolatile memory device shown in FIG. 2. Explanation on those elements will be thus omitted. Further, the first and second clamping circuits 414 and 424 have the same construction and operation. Thus, only the construction and operation of the first clamping circuit 414 will be explained for simplicity.

The first clamping circuit 414 comprises a first NMOS transistor T411 connected between the first load unit 413 and the bit line node BL, a PMOS transistor T412 connected between the power supply voltage (Vcc) terminal and the gate electrode of the first transistor T411 and driven by the potential of the bit line node BL, a second NMOS transistor T413 connected between the gate electrode of the first NMOS transistor T411 and the ground voltage (Vss) terminal and driven by the potential of the bit line node BL, and a switching means T414 connected between the N well terminal in which the PMOS transistor T412 is formed and the drain terminal of the PMOS transistor T412 and driven by the voltage applied to the gate of the PMOS transistor T412.

Like in FIG. 2, the PMOS transistor T412, and the first and second NMOS transistors T411 and T413 operate as a variable resistor device the on resistance of which is changed depending on the voltage of the gate electrode of the transistors T412, T411 and T413. Further, the PMOS transistor T412 serves as a charge supply means for supplying charges to the gate electrode of the first NMOS transistor T411 and the second NMOS transistor T413 serves as a charge discharge means for discharging the charges from the gate electrode of the first NMOS transistor T411 toward the ground voltage (Vss) terminal. The amount of current supplied to the bit line node BL from the power voltage source toward a node connected to the gate electrode of the first NMOS transistor T411 is controlled depending on the voltage of the bit line node BL. Thus, the voltage of the bit line node BL can be applied as a stable voltage under which the device adequately operates.

In the above, the switching means T414 consists of a PMOS transistor. The drain voltage of the PMOS transistor T412 is applied to the N well in which the PMOS transistor T412 is formed, by means of the switching means T414 driven by the voltage of the bit line node BL. Thus, as the threshold voltage of the PMOS transistor T412 is lowered, the operating speed of the PMOS transistor T412 can be improved at a low power supply voltage (Vcc).

The third embodiment of the present invention in FIG. 4 is same to the first embodiment in FIG. 2 in that the threshold voltage of the PMOS transistor T412 is lowered using the switching means T414 except that the switching means is not provided between the drain terminal of the second NMOS transistor T413 and the triple P well terminal (TPW).

In the clamping circuit and the nonvolatile memory device using the same according to the third embodiment, a voltage of a specific node such as the bit line node BL is controlled same to a target operating voltage under which the device properly operates. However, if the voltage of the node is lower than the operating voltage, the voltage of the node can be rapidly raised. Further, the number of the switching means added is small. Thus, the clamping circuit can be more simply implemented.

As mentioned above, according to the present invention, the threshold voltage of the transistor is lowered using the switching means installed between the drain terminal of the transistor and the well terminal. Therefore, the present invention had advantageous effects that it can increase the operating speed of the transistor even at a low power supply voltage without additionally using a manufacture process for the low voltage operation, minimize the ripple voltage and thus prevent generation of defect.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A clamping circuit, comprising:

a first transistor connected between a first node and a second node;

a charge supply means connected between a gate electrode of the first transistor and a power voltage terminal, for supplying charges to the gate electrode of the first transistor depending on a voltage of the second node in order to control the voltage of the second node;

a charge discharge means connected between the gate electrode of the first transistor and a ground voltage terminal, for discharging the charges from the gate electrode of the first transistor depending on the voltage of the second node in order to control the second node; and switching means each connected between a well terminal and a drain terminal of a second transistor constituting the charge supply means, for applying a bias to the well terminal of the second transistor depending on the gate voltage of the second transistor to lower the threshold voltage of the second transistor.

2. The clamping circuit as claimed in claim 1, wherein the first transistor is a NMOS transistor, and the second transistor and the switching means are PMOS transistors.

3. The clamping circuit as claimed in claim 1, wherein the well is an N well.

4. A clamping circuit, comprising:
a first transistor connected between a first node and a second node;
a charge supply means connected between a gate electrode of the first transistor and a power voltage terminal, for supplying charges to the gate electrode of the first transistor depending on a voltage of the second node in order to control the voltage of the second node;
a charge discharge means connected between the gate electrode of the first transistor and a ground voltage terminal, for discharging the charges from the gate electrode of the first transistor depending on the voltage of the second node in order to control the second node; and
switching means each connected between a well terminal and a drain terminal of a second transistor constituting the charge discharge means, for applying a bias to the well terminal of the second transistor depending on the gate voltage of the second transistor to lower the threshold voltage of the second transistor.

5. The clamping circuit as claimed in claim 4, wherein the first transistor, the second transistor and the switching means are NMOS transistors.

6. The clamping circuit as claimed in claim 4, wherein the well is a triple P well.

7. A clamping circuit, comprising:
a first transistor connected between a first node and a second node;
a charge supply means connected between a gate electrode of the first transistor and a power voltage terminal, for supplying charges to the gate electrode of the first transistor depending on a voltage of the second node in order to control the voltage of the second node;
a charge discharge means connected between the gate electrode of the first transistor and a ground voltage terminal, for discharging the charges from the gate electrode of the first transistor depending on the voltage of the second node in order to control the second node;
first switching means each connected between a well terminal and a drain terminal of a second transistor constituting the charge supply means, for applying a bias to the well terminal of the second transistor depending on the gate voltage of the second transistor to lower the threshold voltage of the second transistor; and second switching means each connected between a well terminal and a drain terminal of a third transistor constituting the charge discharge means, for applying a bias to the well terminal of the third transistor depending on the gate voltage of the third transistor to lower the threshold voltage of the third transistor.

8. The clamping circuit as claimed in claim 7, wherein the first transistor, the third transistor and the second switching means are NMOS transistors, and the second transistor and the first switching means are PMOS transistors.

9. The clamping circuit as claimed in claim 7, wherein the well of the second transistor is an N well, and the well of the third transistor is a triple P well.

10. A nonvolatile memory device, comprising:
an main flash memory cell array to which a first address signal is applied, wherein the main flash memory cell array has a plurality of operating flash memory cells;
a first bit line select unit for selecting a bit line of the main flash memory cell array according to a second address signal;
a first clamping circuit claimed in one of claims 1~9 for controlling the bit line voltage of the main flash memory cell array;
a reference flash memory cell array to which the first address signal is applied, wherein the reference flash memory cell array has a plurality of reference flash memory cells;
a second bit line select unit for selecting a bit line of the reference flash memory cell array according to the second address signal;
a second clamping circuit claimed in one of claims 1~9 for controlling the bit line voltage of the reference flash memory cell array; and
a compare unit for comparing the amount of current flowing into the main flash memory cell and the reference flash memory cell selected by the first and second address signals to detect a state of the operating flash memory cell.

* * * * *